US012571820B2

(12) United States Patent
Tamura et al.

(10) Patent No.: US 12,571,820 B2
(45) Date of Patent: Mar. 10, 2026

(54) CURRENT SENSOR

(71) Applicant: Alps Alpine Co., Ltd., Tokyo (JP)

(72) Inventors: Manabu Tamura, Miyagi-ken (JP);
Chiaki Ueda, Miyagi-ken (JP)

(73) Assignee: Alps Alpine Co., Ltd., Tokyo (JP)

( * ) Notice: Subject to any disclaimer, the term of this
patent is extended or adjusted under 35
U.S.C. 154(b) by 57 days.

(21) Appl. No.: 18/620,579

(22) Filed: Mar. 28, 2024

(65) Prior Publication Data

US 2024/0241156 A1      Jul. 18, 2024

Related U.S. Application Data

(63) Continuation of application No.
PCT/JP2022/030372, filed on Aug. 9, 2022.

(30) Foreign Application Priority Data

Oct. 29, 2021    (JP) ................................. 2021-177946

(51) Int. Cl.
*G01R 15/20*          (2006.01)
(52) U.S. Cl.
CPC ........... *G01R 15/207* (2013.01); *G01R 15/20*
(2013.01)
(58) Field of Classification Search
CPC ..... G01R 15/20; G01R 15/207; G01R 15/148
USPC .......................................... 324/117 R, 117 H
See application file for complete search history.

(56) References Cited

U.S. PATENT DOCUMENTS

| | | | | |
|---|---|---|---|---|
| 9,435,829 B2 | 9/2016 | Hebiguchi et al. | | |
| 10,712,370 B2 | 7/2020 | Futakuchi et al. | | |
| 11,204,372 B2 * | 12/2021 | Miyamoto | ........... | G01R 15/205 |
| 12,339,299 B2 * | 6/2025 | Miyamoto | ............. | G01R 15/20 |
| 2018/0238938 A1 | 8/2018 | Feucht et al. | | |
| 2019/0250193 A1 * | 8/2019 | Futakuchi | ............ | G01R 33/072 |
| 2023/0092098 A1 * | 3/2023 | Tamura | ................ | G01R 15/207 |
| | | | | 324/117 R |
| 2025/0199036 A1 * | 6/2025 | Nakayama | ........... | G01R 33/091 |

FOREIGN PATENT DOCUMENTS

| | | |
|---|---|---|
| CN | 110221112 | 9/2019 |
| JP | 2015-190781 | 11/2015 |
| JP | 2018-096795 | 6/2018 |

(Continued)

OTHER PUBLICATIONS

International Search Report from International Application No.
PCT/JP2022/030372 dated Oct. 4, 2022 with translation.

*Primary Examiner* — Arleen M Vazquez
(74) *Attorney, Agent, or Firm* — Beyer Law Group LLP

(57) ABSTRACT

A current sensor has a first bus bar, a second bus bar, and a
third bus bar, which are formed in a plate shape, and also has
a first magnetic sensing unit, a second magnetic sensing unit,
and a third magnetic sensing unit placed so as to respectively
face the first bus bar, second bus bar, and third bus bar. Each
bus bar has a narrow-width portion with the relevant mag-
netic sensing unit placed so as to face it, and also has two
wide-width portions. The second magnetic sensing unit,
which senses a magnetic field generated from the second bus
bar, and the third magnetic sensing unit, which senses a
magnetic field generated from the third bus bar, are offset
from their relevant narrow-width portions toward opposite
sides in the Y-axis direction, when viewed along the Z-axis
direction.

16 Claims, 10 Drawing Sheets

(56)          References Cited

FOREIGN PATENT DOCUMENTS

| | | |
|---|---|---|
| JP | 2019-138815 | 8/2019 |
| JP | 2020-148484 | 9/2020 |
| JP | 2021-039030 | 3/2021 |
| WO | 2013/005458 | 1/2013 |

* cited by examiner

CURRENT SENSOR

CLAIM OF PRIORITY

This application is a Continuation of International Application No. PCT/JP2022/030372 filed on Aug. 9, 2022, which claims benefit of Japanese Patent Application No. 2021-177946 filed on Oct. 29, 2021. The entire contents of each application noted above are hereby incorporated by reference.

BACKGROUND OF THE INVENTION

1. Field of the Invention

The present invention relates to a current sensor that measures a current according to magnetic fields generated by currents flowing in a plurality of adjacent conductors.

2. Description of the Related Art

A generally known multi-channel current sensor has a plurality of bus bars in which a current eligible for detection flows; a magnetic sensor having a magnetoresistance effect element and the like is placed in the vicinity of each bus bar. The current sensor has a magnetic sensor that can be mounted on a circuit board as a chip part. The current sensor outputs the intensity of a magnetic field detected by the magnetic sensor as the detection value of a current.

In a current sensor described in Japanese Unexamined Patent Application Publication No. 2021-39030, each of adjacent bus bars has a recess facing a parallel direction at a portion corresponding to a relevant detection element so that the distance between the adjacent bus bars is prolonged to reduce the adverse effect of electromagnetic induction between the bus bars, which are each a conductor.

However, with the multi-channel current sensor described in Japanese Unexamined Patent Application Publication No. 2021-39030, there is no consideration for the adverse effect from a bus bar adjacent to a bus bar that is a sensing target (detection target) on a magnetic sensor. Therefore, measurement error may occur in a detection value of the magnetic sensor due to the adverse effect of magnetism based not only on a current in the bus bar used as the sensing target but also on a current flowing in the adjacent bus bar.

SUMMARY OF THE INVENTION

In view of the above situation, the present invention provides a current sensor having a plurality of bas bars with superior detection precision, with the suppression of error due to the adverse effect from bus bars that are not eligible for current sensing and are adjacent to a bus bar that is eligible for current sensing and to which a magnetism sensing portion is opposite.

The present invention has the following structure as a means for solving the above problem.

A current sensor has a plurality of bus bars that extend in a first direction and are arranged along a second direction orthogonal to the first direction, and also has a plurality of magnetic sensing units, each of which is capable of sensing a magnetic field generated due to a flow of a current under measurement in one of the plurality of bus bars. The magnetic sensing unit is placed so as to face the bus bar in a third direction orthogonal to the first direction and to the second direction. The plurality of bus bars include a first bus bar, a second bus bar adjacent to the first bus bar on one side in the second direction, and a third bus bar adjacent to the first bus bar on another side in the second direction.

Each of the first bus bar, the second bus bar, and the third bus bar is formed in a plate shape, and is placed so that the direction of a normal to a plate surface matches the third direction, and has a narrow-width portion with the magnetic sensing unit placed so as to face the narrow-width portion, a first wide-width portion linked to one side of the narrow-width portion in the first direction, the first wide-width portion having a larger dimension in the second direction than the narrow-width portion, and a second wide-width portion linked to another side of the narrow-width portion in the first direction, the second wide-width portion having a larger dimension in the second direction than the narrow-width portion. When viewed along the third direction, a second magnetic sensing unit that senses a magnetic field generated from the second bus bar is offset toward the one side in the second direction from the center of the narrow-width portion of the second bus bar in the second direction, and a third magnetic sensing unit that senses a magnetic field generated from the third bus bar is offset toward the other side in the second direction from the center of the narrow-width portion of the third bus bar in the second direction.

Since the second magnetic sensing unit and third magnetic sensing unit are mutually offset toward opposite sides of the first bus bar in the second direction from the center of the narrow-width direction in the second direction, the distance from the second magnetic sensing unit to the first bus bar and the distance from the third magnetic sensing unit to the first bus bar can be increased. Therefore, it is possible to suppress the adverse effect of magnetic fields, which are generated in the vicinity of the corners of the first wide-width portion and second wide-width portion of the first bus bar, the corner being on the same side as the narrow-width portion, on the second magnetic sensing unit and third magnetic sensing unit, which are adjacent to a first magnetic sensing unit disposed so as to face the first bus bar.

The first wide-width portion of the first bus bar, the first wide-width portion of the second bus bar, and the first wide-width portion of the third bus bar may be placed at equal intervals in the second direction, when viewed along the third direction. The second wide-width portion of the first bus bar, the second wide-width portion of the second bus bar, and the second wide-width portion of the third bus bar may be placed at equal intervals in the second direction, when viewed along the third direction. In this case, the interval between adjacent first wide-width portions may be larger than the interval between adjacent second wide-width portions.

Since the first wide-width portions and second wide-width portions are placed at equal intervals, measurement precision is improved with the suppression of the adverse effect received from bus bars, other than the sensing target, of the first, second, or third bus bar, to which the first, second, and third magnetic sensing units are respectively opposed.

The narrow-width portion of the first bus bar, the narrow-width portion of the second bus bar, and the narrow-width portion of the third bus bar may have the same dimension in the second direction and may have the same dimension in the first direction. At least part of each of these narrow-width portions may be placed on the same straight line along the second direction when viewed along the third direction. A first magnetic sensing unit corresponding to the first bus bar, the second magnetic sensing unit corresponding to the second bus bar, and the third magnetic sensing unit corresponding to the third bus bar may be placed on the same straight line along the second direction.

The first wide-width portion of the first bus bar, the first wide-width portion of the second bus bar, and the first wide-width portion of the third bus bar may have the same dimension in the second direction. The second wide-width portion of the first bus bar, the second wide-width portion of the second bus bar, and the second wide-width portion of the third bus bar may have the same dimension in the second direction.

The first wide-width portion of the first bus bar and the second wide-width portion of the first bus bar may have the same dimension in the second direction. The first wide-width portion of the second bus bar and the second wide-width portion of the second bus bar may have the same dimension in the second direction. The first wide-width portion of the third bus bar and the second wide-width portion of the third bus bar may have the same dimension in the second direction.

The narrow-width portion of the first bus bar, the narrow-width portion of the second bus bar, and the narrow-width portion of the third bus bar may be placed at equal intervals in the second direction, when viewed along the third direction.

When the narrow-width portions of the first bus bar, second bus bar, and third bus bar (referred to below as the bus bars when they do need not to be distinguished) have the same size and the narrow-width portions and the first magnetic sensing unit, second magnetic sensing unit, and third magnetic sensing unit (referred to below as the magnetic sensing units when they do not need to be distinguished) are placed and have dimensions as in the above structure, it is possible to suppress the adverse effect from bus bars, to which magnetic sensing units are opposed, other than the sensing target adjacent to the bus bars.

The first magnetic sensing unit, second magnetic sensing unit, and third magnetic sensing unit may be placed at equal intervals in the second direction when viewed along the third direction.

Therefore, it is possible to suppress the adverse effect of bus bars, other than the sensing target, on each magnetic sensing unit.

When a straight line that passes through the center of the narrow-width portion of the first bus bar in the second direction and is parallel to the first direction is taken a first center line and a straight line that passes through the center between the narrow-width portion of the second bus bar and the narrow-width portion of the third bus bar in the second direction and is parallel to the first direction is taken a second center line, the first bus bar may be line symmetric with respect to the first center line of the first bus bar, the second bus bar and the third bus bar may be line symmetric with respect to the second center line, and the first center line and the second center line may match each other when viewed along the third direction.

Therefore, it is possible to suppress the adverse effect of bus bars, other than the sensing target, on the magnetic sensing units.

The center, in the second direction, of the first magnetic sensing unit that senses the magnetic field generated from the first bus bar may be offset from the center of the narrow-width portion of the first bus bar in the second direction, when viewed along the third direction.

In this structure, at a plate-like conductor having a wide width, it is possible to efficiently detect a current flowing near edges in a concentrated manner due to a skin effect and to improve a reduction in the detection sensitivity of a magnetic sensing unit at high frequencies.

A first magnetic sensing unit, the second magnetic sensing unit, and the third magnetic sensing unit may satisfy the same requirements. When viewed along the third direction, the second magnetic sensing unit and the third magnetic sensing unit may be placed in opposite orientations in the first direction and in the second direction. Also, when viewed along the third direction, the first magnetic sensing unit may be offset toward one side in the second direction from the narrow-width portion of the first bus bar and may be placed in the same orientation as the second magnetic sensing unit. Alternatively, the first magnetic sensing unit may be offset toward another side in the second direction from the narrow-width portion of the first bus bar and may be placed in the same orientation as the third magnetic sensing unit.

In this case, the magnetic sensing unit may have a sensor unit that senses magnetism, a signal terminal for use for output to the outside, and a power terminal for power supply. The signal terminal and the power terminal may be disposed so as to protrude from the sensor unit. The signal terminal and the power terminal may be placed at positions at which they do not overlap the narrow-width portion of the bus bar, when viewed along the third direction.

Therefore, one side surface, on which the signal terminal and power terminals are disposed, can be placed so as to be distant from the bus bar. Therefore, even if noise is generated from the bus bar at the on/off switching of a voltage used to control a current under measurement that flows in the bus bar, it is possible to suppress the adverse effect of the noise on the detection result.

The current sensor may have a shield formed from a metal plate in a flat plate shape. The shield may be placed on at least any one side of the magnetic sensing unit in the third direction, and may be placed at a position at which the center of the shield is within the magnetic sensing unit when viewed along the third direction.

The current sensor may have a shield formed from a metal plate. The shield may have an opposing portion and side surface portions protruding from ends on both sides of the opposing portion in the second direction. The opposing portion may be placed on any one side of the magnetic sensing unit and the bus bar in the third direction. The side surface portions may be placed on both sides of the magnetic sensing unit and the bus bar in the second direction.

The shield placed like this can block external magnetic fields such as an induced magnetic field due to a current flowing in an adjacent bus bar, and can suppress the adverse effect of the external magnetic fields.

At the second bus bar, the end face of the narrow-width portion on the other side in the second direction and the end face of the first wide-width portion on the other side in the second direction may be flush with each other; and the end face of the narrow-width portion on the one side in the second direction and the end face of the second wide-width portion on the one side in the second direction may be flush with each other. At the third bus bar, the end face of the narrow-width portion on the one side in the second direction and the end face of the first wide-width portion on the one side in the second direction may be flush with each other; and the end face of the narrow-width portion on the other side in the second direction and the end face of the second wide-width portion on the other side in the second direction may be flush with each other.

In this structure, a current in each narrow-width portion flows along the first direction, so magnetism generated due to the current can be precisely sensed by the magnetic sensing unit.

With the current sensor of the present invention, the second magnetic sensing unit and third magnetic sensing unit are offset in directions away from the narrow-width portion of the first bus bar, to which the first magnetic sensing unit is opposed. Therefore, the adverse effect of magnetism on the second magnetic sensing unit and third magnetic sensing unit is suppressed, the magnetism being generated by a current under measurement that flows in the first bus bar. Thus, it is possible to provide a current sensor with superior sensing precision.

DESCRIPTION OF THE PREFERRED EMBODIMENTS

Figures 1A, 1B:
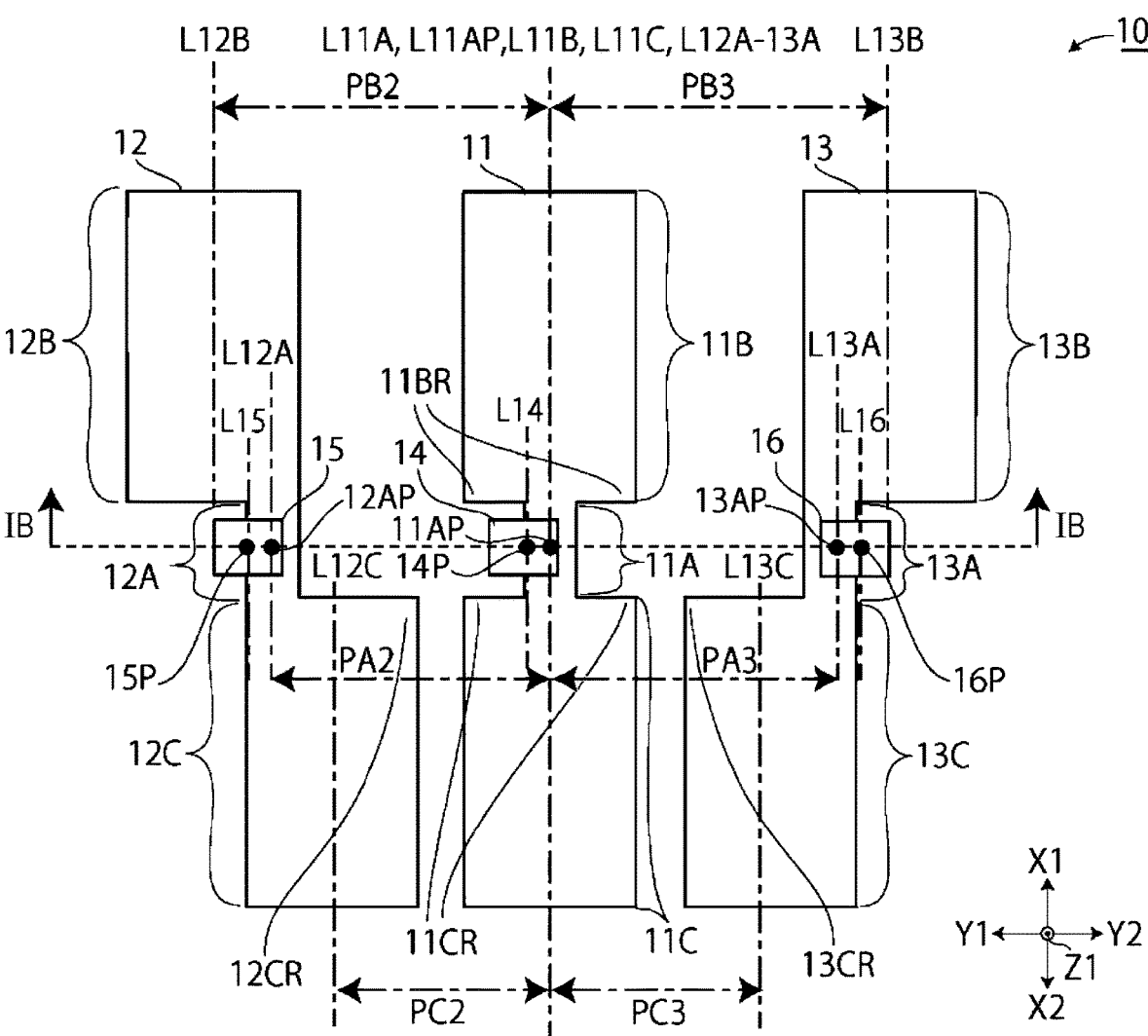
FIG. 1A is a plan view illustrating the shapes of bus bars and magnetic sensing units in embodiment 1 and their positional relationship.
FIG. 1B is a sectional view along line IB-IB.

Embodiments of the present invention will be described below with reference to the attached drawings. Identical members are assigned identical reference characters in the drawings and repeated descriptions will be appropriately omitted. In each drawing, an X-Y-Z coordinate system is indicted as a basic coordinate system.

Figure 2A:
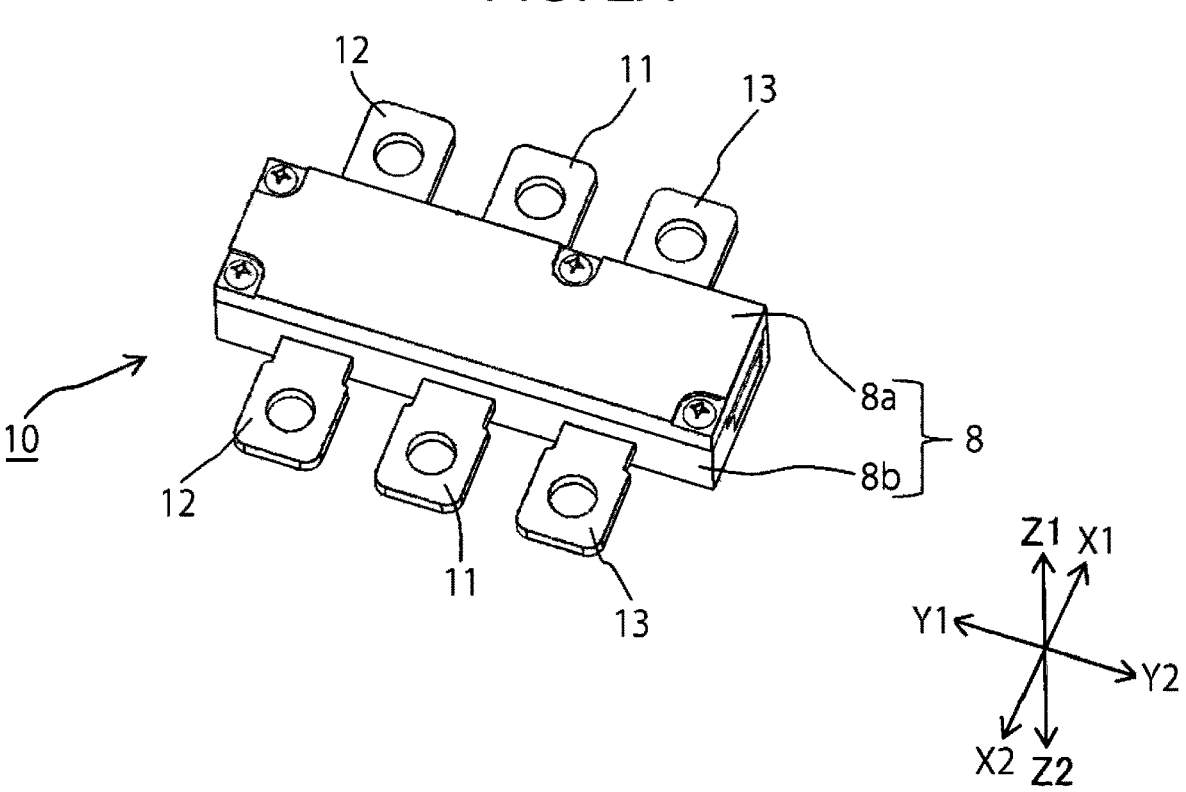
FIG. 2A is a perspective view illustrating the basic structure of a current sensor.
Figure 2B:
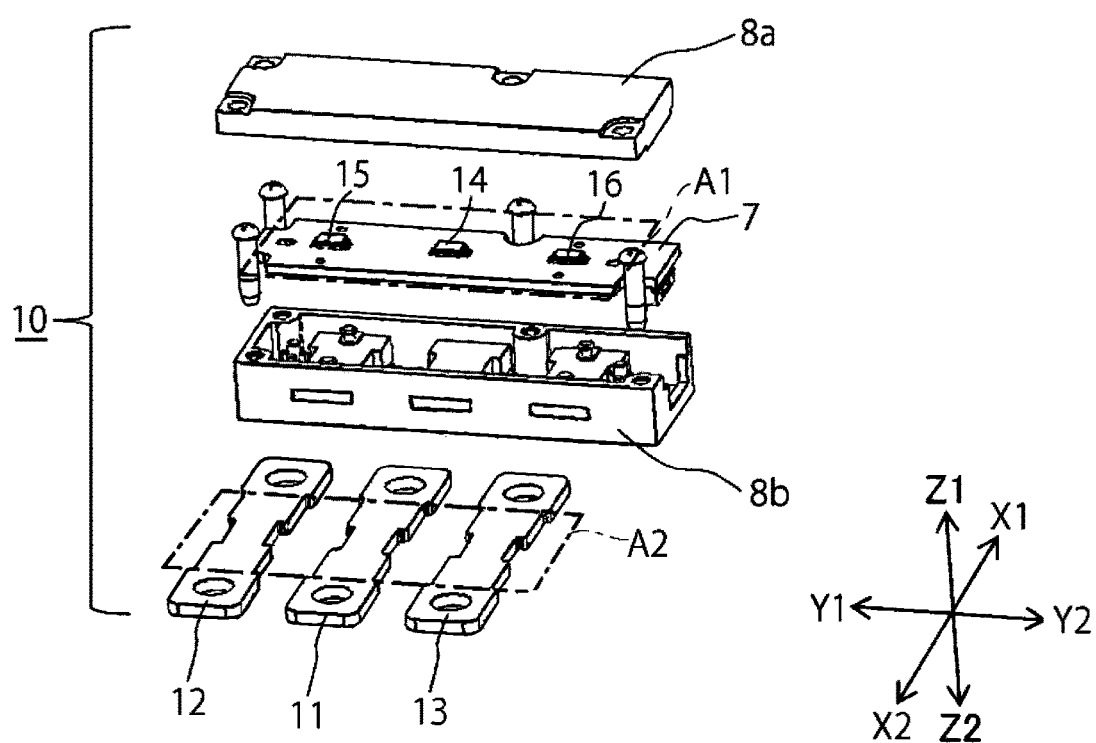
FIG. 2B is an exploded perspective view of the current sensor.

FIG. 2A is a perspective view illustrating a current sensor 10, and FIG. 2B is an exploded perspective view of the current sensor 10. The basic structure of the current sensor 10 will be described with reference to these drawings. The sizes and positional relationship of individual members such as bus bars and magnetic sensing units will be described with reference to other drawings.

As illustrated in FIG. 2A, the current sensor 10 has a case 8 in a substantially rectangular parallelepiped shape, the case 8 being structured by fixing a cover member 8a on the upper side (on the Z1 side in the Z-axis direction) and a case member 8b on the lower side (on the Z2 side in the Z-axis direction) together. Three bus bars 11, 12, and 13 pass through the case member 8b along the width direction (X-axis direction) of the case 8.

The bus bars 11, 12, and 13 are each a conductive material formed in a plate shape extending in a strip-shape along the width direction of the case 8. The direction of a normal to a plate surface is the Z-axis direction. The bus bars 11, 12, and 13 are placed side by side along the Y-axis direction so that two opposing plate surfaces face the top and bottom of the case 8. Both ends, which are portions for connection to the outside, of each of the bus bars 11, 12, and 13 in the X-axis direction do not necessarily have to be line symmetric.

As illustrated in FIG. 2B, a circuit board 7 is placed in the case 8 along the longitudinal direction. On the circuit board 7, magnetic sensing units 14, 15, and 16 are placed in an X-Y plane (plane including the X axis and Y axis) at positions at which they respectively correspond to the bus bars 11, 12, and 13. At least part of a sensor portion in each of the magnetic sensing units 14, 15, and 16 faces the relevant bus bar, and overlaps the opposing bus bar when viewed along the Z axis.

The magnetic sensing units 14, 15, and 16 detect an induced magnetic field generated by a current (current under measurement) flowing in the bus bars 11, 12, and 13, and measure the current value of the current under measurement. It is preferable for the magnetic sensing units 14, 15, and 16 to be disposed on the same surface of the circuit board 7. The magnetic sensing units 14, 15, and 16 are formed by, for example, using a magnetoresistive effect element such as a giant magnetoresistive effect (GMR) element.

The structure and placement of a conventional current sensor 90 will be described before the current sensor 10 according to an embodiment of the present invention is described.

Figures 9A, 9B:
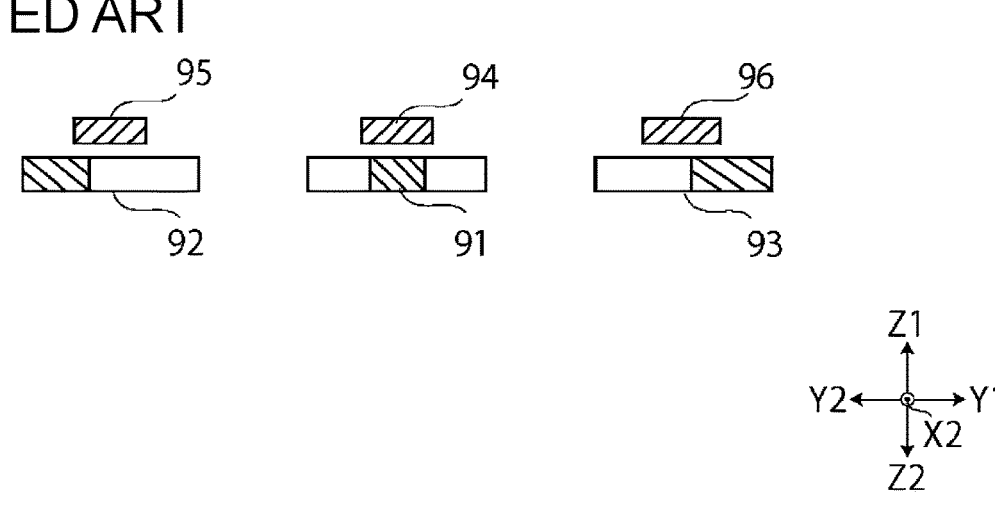
FIG. 9A is a plan view illustrating the shapes of conventional bus bars and conventional magnetic sensing units and their positional relationship.
FIG. 9B is a sectional view along line IXB-IXB.

FIG. 9A is a plan view of bus bars 91, 92, and 93 and magnetic sensing units 94, 95, and 96 in the conventional current sensor 90, and FIG. 9B is a sectional view along line IXB-IXB in FIG. 9A. The longitudinal direction of the bus bars 91, 92, and 93 in the current sensor 90 matches the X-axis direction, and they are arranged along the Y-axis direction.

The bus bar 91 has a structure in which a wide-width portion 91B and a wide-width portion 91C, which have a wider width in the Y-axis direction than a narrow-width portion 91A, are disposed on both sides of the narrow-width portion 91A in the X-axis direction. Similarly, the bus bar 92 has a wide-width portion 92B and a wide-width portion 92C, and the bus bar 93 has a wide-width portion 93B and a wide-width portion 93C.

In the current sensor 90, the magnetic sensing units 94, 95, and 96 are respectively placed so as to face the narrow-width portions 91A, 92A, and 93A of the bus bars 91, 92, and 93. The current sensor 90 measures magnetism based on currents under measurement that flow in the narrow-width portions 91A, 92A, and 93A with the magnetic sensing units 94, 95, and 96.

With the current sensor 90, when viewed along the Z-axis direction, the magnetic sensing unit 94 and bus bar 91 are placed so that a match is made between a straight line L94 passing through the center of the width of the magnetic sensing unit 94 in the Y-axis direction and a straight line L91A passing through the center of the width of the narrow-width portion 91A of the bus bar 91 in the Y-axis direction. In contrast, straight lines L92A and L93 are offset in opposite directions respectively from a straight line L95 passing through the center of the width of the magnetic sensing unit 95 in the Y-axis direction and from a straight line L96 passing through the center of the width of the magnetic sensing unit 96 in the Y-axis direction, the straight line L92A passing through the center of the width of the narrow-width portion 92A of the bus bar 92 in the Y-axis direction, the straight line L93A passing through the center of the width of the narrow-width portions 93A of the bus bar 93 in the Y-axis direction. Specifically, the straight line L95 is positioned more on the Y1 side than the straight line L92A, and the straight line L96 is positioned more on the Y2 side than the straight line L93A.

With the current sensor 90, the magnetic sensing units 95 and 96 are placed with offsets in directions toward the bus bar 91 from the centers of the narrow-width portions 92A and 93A in the Y-axis direction, when viewed along the Z-axis direction. Therefore, the adverse effect of magnetism based on a current under measurement that flows in corners 91BR and corners 91CR of the bus bar 91 may cause error in the magnetic sensing units 95 and 96, the corners 91BR being part of the wide-width portion 91B on the same side as the narrow-width portion 91A, the corners 91CR being part of the wide-width portion 91C on the same side as the narrow-width portion 91A. That is, the current flowing in the corners 91BR and corners 91CR may cause error in the magnetic sensing units 95 and 96 and may lower the measurement precision of the current sensor 90.

Thus, it was found that to suppress the adverse effect of the current flowing in the corners 91BR and corners 91CR of the bus bar 91, directions in which the magnetic sensing units 95 and 96 are offset are important and that the measurement precision of the current sensor 90 was improved by offsetting the magnetic sensing units 95 and 96 in directions away from the narrow-width portion 91A. Embodiments will be described below about the present invention based on this finding.

Embodiment 1

FIG. 1A is a plan view of the bus bars 11, 12, and 13 and magnetic sensing units 14, 15, and 16 in the current sensor 10 when the areas A1 and A2 in FIG. 2B are viewed along the Z direction. FIG. 1B is a sectional view along line IB-IB in FIG. 1A. Shapes and a positional relationship will be described about the bus bars 11, 12, and 13 and magnetic sensing units 14, 15, and 16 with reference to these drawings.

The current sensor 10 has a plurality of bus bars, denoted 11, 12, and 13, which are a first bus bar, a second bus bar, and a third bus bar, as well as a plurality of magnetic sensing units, denoted 14, 15, and 16, which a first magnetic sensing unit, a second magnetism sensing portion, and a third magnetic sensing unit. The bus bars 11, 12, and 13 extend in the X-axis direction (first direction) and are arranged along the Y-axis direction (second direction) orthogonal to the X-axis direction. The magnetic sensing units 14, 15, and 16 can sense magnetic fields generated due to flows of currents under measurement in the bus bars 11, 12, and 13.

The magnetic sensing units 14, 15, and 16 are arranged in that order so as to face the bus bars 11, 12, and 13 in the Z-axis direction (third direction) orthogonal to the X-axis direction and Y-axis direction. Specifically, the bus bar 12 is placed adjacent to the bus bar 11 on the Y1 side (one side) of the bus bar 11 in the Y-axis direction, and the bus bar 13 is placed adjacent to the bus bar 11 on the Y2 side (another side) of the bus bar 11 in the Y-axis direction.

Each of the bus bars 11, 12, and 13 is formed in a plate shape, and is placed so that the direction of a normal N to the plate surface matches the Z-axis direction as illustrated in FIG. 1B.

The bus bar 11 has a narrow-width portion 11A facing the magnetic sensing unit 14, a wide-width portion 11B linked to the X1 side (one side) of the narrow-width portion 11A in the X-axis direction, and a wide-width portion 11C linked to the X2-side (another side). The wide-width portion 11B and wide-width portion 11C of the bus bar 11 are rectangular, their dimensions (widths) in the Y-axis direction being equal. The wide-width portion 11B and wide-width portion 11C each have a wider dimension (width) in the Y-axis direction than the narrow-width portion 11A.

Similarly as with the bus bar 11, the bus bars 12 and 13 have narrow-width portions 12A and 13A facing the magnetic sensing units 15 and 16, wide-width portions 12B and 13B linked to the X1 side of the narrow-width portions 12A and 13A in the X-axis direction, and the wide-width portions 12C and 13C liked to the X2-side. The wide-width portions 12B and 13B and wide-width portions 12C and 13C are rectangular, their dimensions (widths) in the Y-axis direction being equal. The wide-width portions 12B and 12C each have a larger dimension (width) in the Y-axis direction than the narrow-width portion 12A. The wide-width portions 13B and 13C each have a larger dimension (width) in the Y-axis direction than the narrow-width portion 13A.

The center 15P of the width of the magnetic sensing unit 15, which senses the magnetic field generated from the bus bar 12, in the Y-axis direction is offset from the center 12AP of the width of the narrow-width portion 12A in the Y-axis direction toward the Y1 side in the Y-axis direction, when viewed along the Z-axis direction. Similarly, the center 16P of the width of the magnetic sensing unit 16, which senses the magnetic field generated from the bus bar 13, in the Y-axis direction is offset from the center 13AP of the width of the narrow-width portion 13A in the Y-axis direction toward the Y2 side in the Y-axis direction. That is, the magnetic sensing unit 15 and magnetic sensing unit 16 are placed with offsets in directions away from the bus bar 11 from the centers 12AP and 13AP.

To indicate the positional relationship between individual portions of the bus bars 11, 12, and 13 and the magnetic sensing units 14, 15, and 16 corresponding to the bus bars 11, 12, and 13, a straight line passing through the center of the width of each member in the Y-axis direction is indicated in FIG. 1A by a reference number prefixed with L.

Each of the magnetic sensing units 15 and 16 is offset in a direction away from the bus bar 11 in the Y-axis direction so that the magnetic sensing unit 15 is placed more on the Y1 side than the opposing narrow-width portion 12A and the magnetic sensing unit 16 is placed more on the Y2 side than the opposing narrow-width portion 13A. In this placement, the distance from the magnetic sensing unit 15 to the bus bar 11 and the distance from the magnetic sensing unit 16 to the bus bar 11 can be increased. At the bus bar 11, therefore, the measurement precision of the current sensor 10 can be improved with the suppression of error due to the adverse effect of magnetic fields on the magnetic sensing unit 15 and magnetic sensing unit 16, the magnetic fields being generated in the vicinity of corners 11BR, on the same side as the narrow-width portion 11A, of the wide-width portion 11B and in the vicinity of corners 11CR, on the same side as the narrow-width portion 11A, of the wide-width portion 11C.

In FIG. 1A, the corner 11BR, on the same side as the narrow-width portion 11A, of the wide-width portion 11B is formed by a side, extending in the first direction (X-axis direction), of the wide-width portion 11B, and a side, extending in the second direction (Y-axis direction), of the wide-width portion 11B, the side being formed at the boundary between the wide-width portion 11B and the narrow-width portion 11A. Similarly, the corner 11CR, on the same side as the narrow-width portion 11A, of the wide-width portion 11C is formed by a side, extending in the first direction (X-axis direction), of the wide-width portion 11C, and a side, extending in the second direction (Y-axis direction), of the wide-width portion 11C, the side being formed at the boundary between the wide-width portion 11C and the narrow-width portion 11A.

Here, a way in which currents flow in the bus bars 11 and 12 will be described. A way (current density) in which a current flows in a bus bar is not uniform. There are a portion at which a current is likely to flow and a portion at which a current is less likely to flow. In FIG. 1, it will be assumed that a current flows from the X1 side toward the X2 side. At the bus bar 11, in the vicinity of the boundary between the wide-width portion 11B and the narrow-width portion 11A, a current is more likely to flow at a point closer to the narrow-width portion 11A, so the current density becomes high. Thus, the magnetic flux density of the magnetic field based on the current becomes large in the vicinity of a straight line L11A and becomes relatively smaller at a greater distance from the straight line L11A. This tendency related to the difference in the magnitude of the magnetic flux density also similarly applies in the vicinity of the boundary between the wide-width portion 11C and the narrow-width portion 11A.

As for the difference in the magnitude of the magnetic flux density, the bus bar 12 also has a similar tendency. In the vicinity of the boundary between the wide-width portion 12B and the narrow-width portion 12A, the magnetic flux density in the vicinity of the straight line L12A becomes larger at a point closer to the narrow-width portion 12A and becomes relatively small at a distance from the straight line L12A. A similar tendency also applies in the vicinity of the boundary between the wide-width portion 12C and the narrow-width portion 12A.

Next, a comparison will be made between the current density at the corner 11CR, on the same side as the narrow-width portion 11A, of the wide-width portion 11C of the bus bar 11 and the current density at a corner 12CR, on the same side as the narrow-width portion 12A, of the wide-width portion 12C of the bus bar 12. The distance from the straight line L12A to the corner 12CR, on the same side as the narrow-width portion 12A, of the wide-width portion 12C of the bus bar 12 is greater than the distance between the corner 11CR of the bus bar 11 and the straight line L11A. Therefore, the current density at the corner 12CR, on the same side as the narrow-width portion 12A, of the wide-width portion 12C of the bus bar 12 becomes smaller than the current density at the corner 11CR of the bus bar 11 and becomes a value near 0. That is, practically no current flows.

Therefore, when the magnetic sensing unit 14 is offset toward the bus bar 12 from the straight line L11A, the magnetic sensing unit 14 comes close to the corner 12CR of the wide-width portion 12C of the bus bar 12. However, a magnetic field that is so large that the magnetic sensing unit 14 is affected is not generated from the corner 12CR of the wide-width portion 12C. Thus, the measurement precision of the magnetic sensing unit 14 is not worsened due to the adverse effect of a magnetic field from the corner 12CR. Even when the magnetic sensing unit 14 is offset toward the bus bar 13 from the straight line L11A, the measurement precision of the magnetic sensing unit 14 is not worsened due to the adverse effect of a magnetic field generated near the corner 13CR of the wide-width portion 13C of the bus bar 13.

The narrow-width portion 11A of the bus bar 11, the narrow-width portion 12A of the bus bar 12, and the narrow-width portion 13A of the bus bar 13 may be placed side by side at equal intervals in the Y-axis direction, when viewed along the Z-axis direction. That is, an interval PA2 between the narrow-width portion 11A and the narrow-width portion 12A and an interval PA3 between the narrow-width portion 11A and the narrow-width portion 13A are equal to each other in the Y-axis direction.

The wide-width portion 11B of the bus bar 11, the wide-width portion 12B of the bus bar 12, and the wide-width portion 13B of the bus bar 13 may be placed side by side at equal intervals in the Y-axis direction. These wide-width portions correspond to a first wide-width portion. An interval PB2 between the wide-width portion 11B and the wide-width portion 12B and an interval PB3 between the wide-width portion 11B and the wide-width portion 13B are equal to each other in the Y-axis direction.

The wide-width portion 11C of the bus bar 11, the wide-width portion 12C of the bus bar 12, and the wide-width portion 13C of the bus bar 13 may be placed side by side at equal intervals in the Y-axis direction. These wide-width portions correspond to a second wide-width portion. An interval PC2 between the wide-width portion 11C and the wide-width portion 12C and an interval PC3 between the wide-width portion 11C and the wide-width portion 13C are equal to each other in the Y-axis direction.

Among these intervals, the interval PB2 (=PB3) is the largest, followed by the interval PA2 (=PA3) and interval PC2 (=PC3) in that order. The interval PB2 between the wide-width portions 11B and 12B may be larger than the interval PC2 between the wide-width portions 11C and 12C.

When the wide-width portions 11B, 12B, and 13B and wide-width portions 11C, 12C, and 13C are placed at equal intervals, it is possible to suppress the adverse effect of magnetic fields from bus bars, other than the sensing target, of the bus bar 11, 12, and 13, to which the magnetic sensing units 14, 15, and 16 are respectively opposed, so the measurement precision of the current sensor 10 becomes superior.

The narrow-width portion 11A of the bus bar 11, the narrow-width portion 12A of the bus bar 12, and the narrow-width portion 13A of the bus bar 13 may have the same dimension in the Y-axis direction and also may have the same dimension in the X-axis direction. The outside shapes of the narrow-width portions 11A, 12A, and 13A are identical when viewed along the Z-axis direction, and their centers 11AP, 12AP, and 13AP in the Y-axis direction may be on the same straight line (line IB-IB). At least part of the narrow-width portions 11A, 12A, 13A only need to be placed on the straight line IB-IB along the Y-axis direction. The centers 11AP, 12AP, and 13AP do not necessarily have to be on the straight line IB-IB.

The wide-width portion 11B of the bus bar 11 and the wide-width portion 11C of the bus bar 11 may have the same dimension in the Y-axis direction. The wide-width portion 12B of the bus bar 12 and the wide-width portion 12C of the bus bar 12 may have the same dimension in the Y-axis direction. The wide-width portion 13B of the bus bar 13 and the wide-width portion 13C of the bus bar 13 may have the same dimension in the Y-axis direction.

When the bus bars 11, 12, and 13 are shaped and placed as described above, it is possible to suppress the adverse effect from bus bars other than the sensing target, of the bus bars 11, 12, and 13, to which the magnetic sensing units 14, 15, and 16 are respectively opposed and to suppress error in precision of measurement by the magnetic sensing units 14, 15, and 16. When the narrow-width portions 11A, 12A, and 13A are placed as described above, the sizes, in the X-axis direction, of the magnetic sensing units 14, 15, and 16 opposed to them can be reduced.

The bus bar 11 may be shaped so as to be line symmetric with respect to the straight line L11A, which passes through the center 11AP of the narrow-width portion 11A of the bus bar 11 and is parallel to the X-axis direction, when viewed along the Z-axis direction.

The bus bars 12 and 13 may be shaped and placed so as to be line symmetric with respect to a straight line L12A-13A, which passes through the center between the straight lines L12A and L13A in the Y-axis direction and is parallel to the X-axis direction. In FIG. 1A, the center between the straight line L12A and the straight line L13A in the Y-axis direction matches the center 11AP of the narrow-width portion 11A.

In the aspect illustrated in FIG. 1A, there is a match between the straight line L11A, which is a first center line of the narrow-width portion 11A of the bus bar 11 and the straight line L12A-13A, which is a second center line between the narrow-width portion 12A of the bus bar 12 and the narrow-width portion 13A of the bus bar 13. Since the shape of the bus bar 11 is line symmetric, the straight lines L11B and L11C may also match both the straight line L11A, which is the first center line, and the straight line L12A-13A, which is the second center line. In this structure, it is possible to suppress the adverse effect from bus bars, other than the sensing target, of the bus bars 11, 12, and 13 on the magnetic sensing units 14, 15, and 16.

The magnetic sensing unit 14, which senses the magnetic field generated from the bus bar 11, may be offset in the Y1 direction from the narrow-width portion 11A when viewed along the Z-axis direction, so that a straight line L14 passing through the center 14P of the magnetic sensing unit 14, which senses the magnetic field generated from the bus bar 11, in the Y-axis direction is positioned more in the Y1 direction than a straight line L11AP passing through the center 11AP of the narrow-width portion 11A of the bus bar 11 in the Y-axis direction. In this structure, at the bus bar 11, which is a plate-like conductor having a wide width, it is possible to efficiently detect a current flowing near edges in a concentrated manner and to suppress a reduction in the detection sensitivity of a magnetic sensing unit at high frequencies.

A current sensor is attached in, for example, an inverter in an automobile. In this case, the current sensor is attached between a power module and a motor and measures a current flowing across them. A terminal pitch often differs between the power module and the motor. When the current sensor 10 is placed in an inverter, the current sensor 10 needs to be placed between the power module side and the motor side, the terminal pitches of which are different. In view of this, with the current sensor 10, the wide-width portions 11B, 12B, and 13B (interval PB2=PB3) and the wide-width portions 11C, 12C, and 13C (interval PC2=PC3) have different pitches, as illustrated in FIG. 1A. When the terminal pitch of the current sensor differs between the input side and the output side, a member for pitch adjustment is unnecessary, so the current sensor 10 also has effects in terms of the ease of attachment and an environmental resistance load.

In the current sensor 10 including the bus bars 11, 12, and 13, which have different pitches between the X1 side and the X2 side, if the magnetic sensing unit 15 facing the narrow-width portion 12A and the magnetic sensing unit 16 facing the narrow-width portion 13A are offset toward the bus bar 11 as in the conventional current sensor 90 illustrated in FIG. 9A, the distances between the magnetic sensing unit 15 and the corners 11BR and 11CR of the bus bar 11 are shortened and the distances between the magnetic sensing unit 16 and the corners 11BR and 11CR of the bus bar 11 are also shortened. Thus, error in the magnetic sensing units 15 and 16 due to the adverse effect from the bus bar 11 becomes large.

If the magnetic sensing units 15 and 16 are offset toward the same side (Y1 or Y2 side) in the Y-axis direction, one of the magnetic sensing units 15 and 16 moves away from the corners 11BR and 11CR and the other comes close to them. Therefore, the one magnetic sensing unit moving away is less likely to receive the adverse effect of the magnetic field generated by the adjacent bus bar (bus bar 11), and the other magnetic sensing unit coming close is likely to receive the adverse effect of the magnetic field generated by the adjacent bus bar. Therefore, measurement error is likely to occur due to the difference in the adverse effect of the magnetic field from the bus bar 11 between the magnetic sensing units 15 and 16. Therefore, error in different extents is caused by the adverse effect of the adjacent bus bar on the magnetic sensing units 15 and 16.

In view of this, in this embodiment, to deal with different pitches among the bus bars 11, 12, and 13 between the X1 and X2 sides, the magnetic sensing units 15 and 16 are placed in directions away from the narrow-width portion 11A of the bus bar 11 in the Y-axis direction so that the magnetic sensing units 15 and 16 are less likely to receive the adverse effect from the corners 11BR and 11CR of the bus bar 11. Specifically, the magnetic sensing unit 15 is offset toward the Y1 side and the magnetic sensing unit 16 is offset toward the Y2 side. In this structure, when the bus bars 12 and 13, illustrated in FIG. 1A, in a crank shape are used to make a difference in pitch between the X1 and X2 sides, it is possible to suppress the adverse effects of the magnetic field generated from the bus bar 11, which is line symmetric with respect to the straight line L11A, on the magnetic sensing units 15 and 16 and to make the adverse effects substantially the same extent.

As described above, in a current sensor including three bus bars having different intervals between the input side and the output side, magnetic sensing units facing the bus bars on the both sides are offset toward opposite sides in the Y-axis direction so that the distances from the bus bar at the center in the Y-axis direction becomes large, so it is possible to provide a current sensor with superior measurement precision.

Embodiment 2

Figures 3A, 3B:
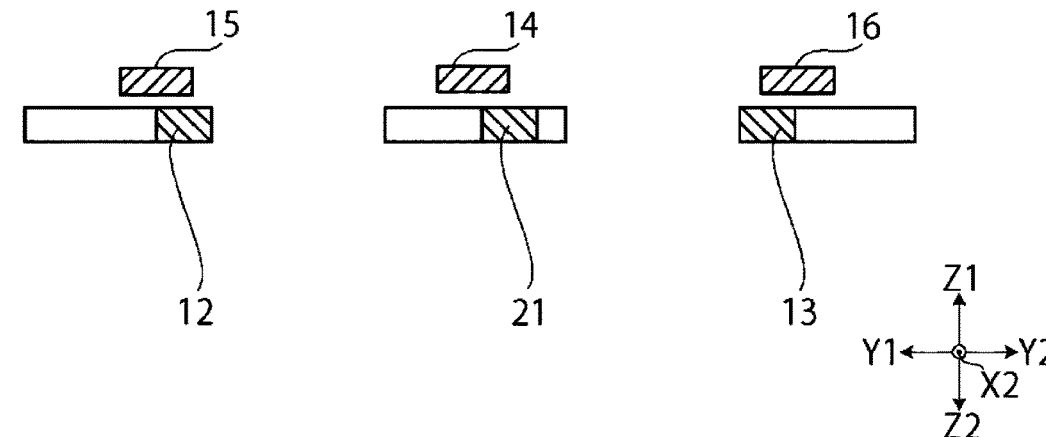
FIG. 3A is a plan view illustrating bus bars and magnetic sensing units in embodiment 2.
FIG. 3B is a sectional view along line IIIB-IIIB.

FIG. 3A is plan view illustrating bus bars 21, 12, and 13 and magnetic sensing units 14, 15, and 16 in a current sensor 20 according to this embodiment, and FIG. 3B is a sectional view along line IIIB-IIIB in FIG. 3A. The current sensor 20 differs from the current sensor 10 in that the bus bar 21 is not line symmetric unlike the bus bar 11 in embodiment 1, but has a shape in which a narrow-width portion 21A is offset in the Y2 direction when viewed along the Z-axis direction.

When the bus bar 21 is used, the magnetic sensing units 14, 15, and 16 can be placed at equal intervals in the Y-axis direction.

With the current sensor 20, the magnetic sensing units 14, 15, and 16 are placed so that an interval PD5 between the magnetic sensing units 14 and 15 in the Y-axis direction and an interval PD6 between the magnetic sensing units 14 and 16 in the Y-axis direction are equal to each other and the magnetic sensing units 14, 15, and 16 are at equal intervals (pitches). In this structure, when shields with the same size are individually provided for the magnetic sensing units 14, 15, and 16, for example, the effect of the shields can be maximized.

The current sensor 20 differs from the embodiment of the current sensor 10 illustrated in FIG. 1A in a structure in which the narrow-width portion 21A of the bus bar 21 positioned at the midpoint is offset in the Y2 direction from a straight line L21B and a straight line L21C, which respectively pass through the centers of wide-width portions 21B and 21C in the Y-axis direction and are parallel to the X axis. Thus, the interval PA2 between the wide-width portions 21A and 12A is larger than the interval PA3 between the wide-width portions 21A and 13A.

Embodiment 3

Figure 4A:
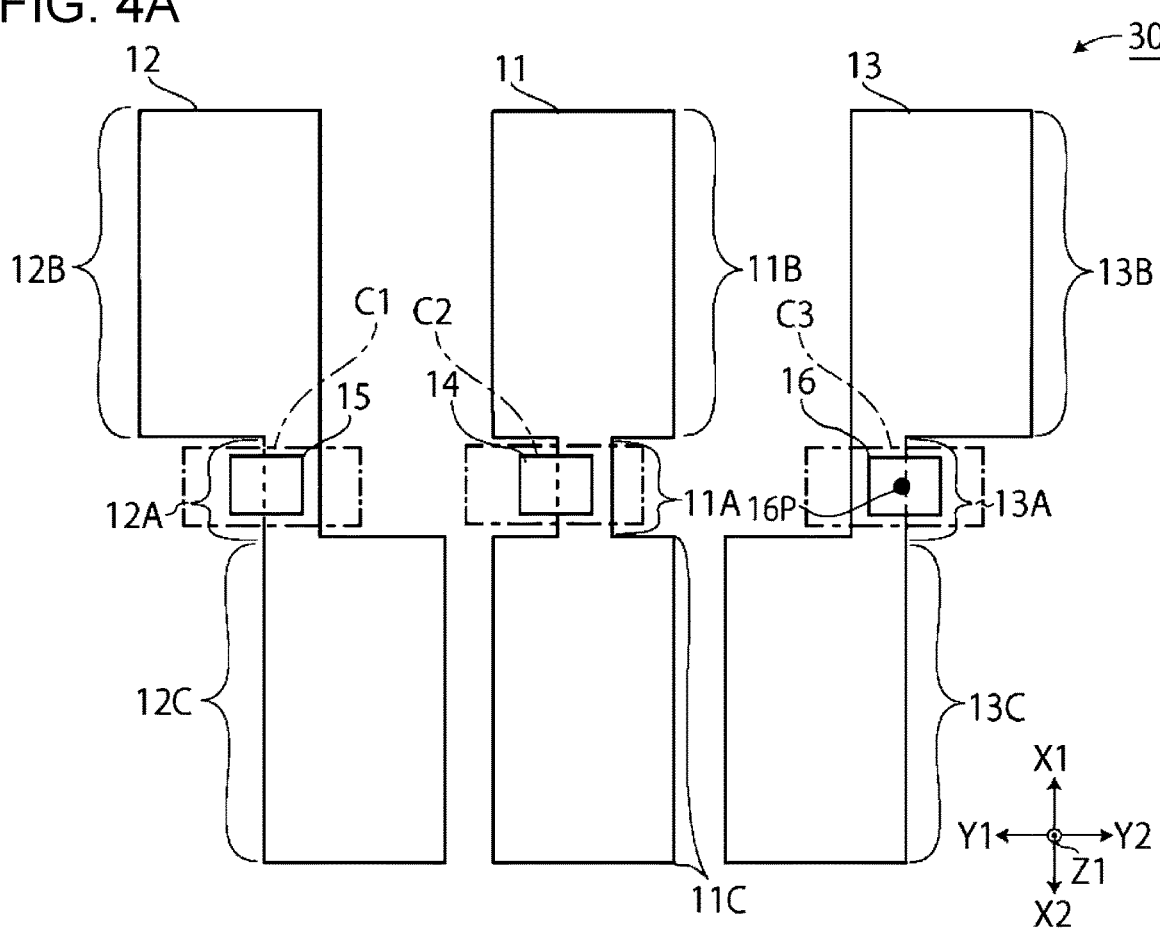
FIG. 4A is a plan view illustrating bus bars and magnetic sensing units in embodiment 3.
Figure 4B:
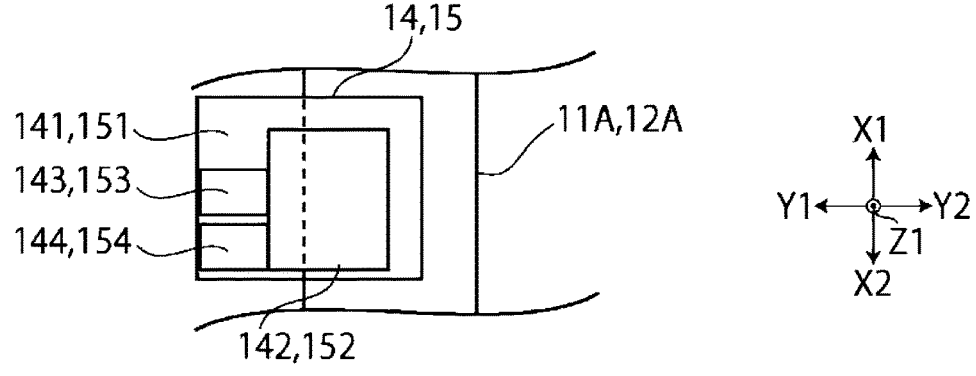
FIG. 4B is an enlarged plan view of areas C1 and C2.
Figure 4C:
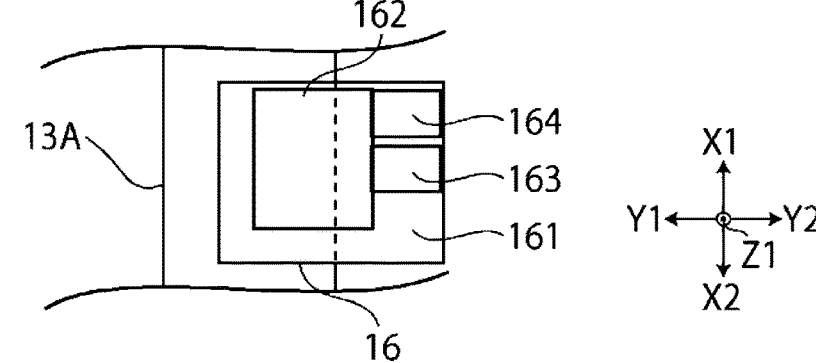
FIG. 4C is an enlarged plan view of an area C3.

FIG. 4A is a plan view illustrating bus bars 11, 12, and 13, and magnetic sensing units 14, 15, and 16 in a current sensor 30 according to this embodiment, FIG. 4B is an enlarged plan view of areas C1 and C2 in FIGS. 4A, and 4C is an enlarged plan view of an area C3 in FIG. 4A.

The magnetic sensing units 14, 15, and 16 in the current sensor 30 may satisfy the same requirements. However, the magnetic sensing unit 16 may be oriented in the opposite direction to the magnetic sensing unit 15 in the X-axis direction and Y-axis direction, when viewed along the Z-axis direction. The magnetic sensing unit 15 is oriented in the same direction as the magnetic sensing unit 14 in the X-axis direction and Y-axis direction, but the magnetic sensing unit 16 is oriented in the opposite direction to the magnetic sensing unit 14 in the X-axis direction and Y-axis direction. That is, the structure of the magnetic sensing unit 16 is equal to a structure in which the magnetic sensing unit 14 is rotated by 180° in an XY plane around the center 16P.

As illustrated in FIGS. 4A and 4B, in the current sensor 30, the magnetic sensing unit 14 may be offset from the narrow-width portion 11A of the bus bar 11 toward the Y1 side in the Y-axis direction, and the magnetic sensing unit 15 may also be offset from the narrow-width portion 12A of the bus bar 12 toward the Y1 side in the Y-axis direction, when viewed along the Z-axis direction. Since each of the magnetic sensing units 14 and 15 is offset in the same direction from the relevant narrow-width portion, the magnetic sensing units 14 and 15 are oriented in the same direction. When the magnetic sensing unit 14 is offset from the narrow-width portion 11A of the bus bar 11 toward the Y2 side in the Y-axis direction, the magnetic sensing unit 14 may be oriented in the same direction as the magnetic sensing unit 16.

As illustrated in FIGS. 4B and 4C, the magnetic sensing units 14, 15, and 16 respectively may have, on main bodies 141, 151, and 161, sensor units 142, 152, and 162, which senses magnetism, signal terminals 143, 153, and 163 for use for output to the outside, and power terminals 144, 154, and 164 for power supply. The signal terminals 143 and 153 and power terminals 144 and 154 may be disposed so as to protrude from the sensor units 142 and 152 in the Y1 direction. The signal terminal 163 and power terminal 164 may be disposed so as to protrude from the sensor unit 162 in the Y2 direction.

The signal terminals 143, 153, and 163 and the power terminals 144, 154, and 164 may be placed at positions at which they do not overlap the narrow-width portions 11A, 12A, and 13A of the bus bars 11, 12, and 13, when viewed along the Z-axis direction. Although only the signal terminals 143, 153, and 163 and the power terminals 144, 154, and 164 are illustrated in FIGS. 4B and 4C, general terminal parts for other use may be provided besides them.

The magnetic sensing units 15 and 16 are offset from the narrow-width portions 12A and 13A toward opposite sides on the Y-axis direction, when viewed along the Z-axis direction. Thus, if the magnetic sensing unit 16 is oriented in the same direction as the magnetic sensing unit 15 illustrated in FIG. 4B, the signal terminal 163 and power terminal 164 overlap the narrow-width portion 13A, when viewed along the Z-axis direction. To prevent this, the magnetic sensing unit 16 is oriented in the direction opposite to the magnetic sensing unit 15 in FIG. 4A, as illustrated in FIG. 4C. Thus, one side surface, on which the signal terminals 143, 153, and 163 and the power terminals 144, 154, and 164 are disposed, of the main bodies 141, 151, and 161 can be placed so as to be distant from the narrow-width portions 11A, 12A, and 13A.

If noise enters the magnetic sensing units 14, 15, and 16 from the signal terminals 143, 153, and 163 or the power terminals 144, 154, and 164, error is likely to occur in measurement results. Therefore, noise is likely to be generated from the bus bars 11, 12, and 13 at the on/off switching of voltages that control currents under measurement that flow in the bus bars 11, 12, and 13. If the signal terminals 143, 153, and 163 and the power terminals 144, 154, and 164 are placed at positions at which they overlap the narrow-width portions 11A, 12A, and 13A, noise generated due to the on/off switching of the voltages is likely to enter the magnetic sensing units 14, 15, and 16. When the signal terminals 143, 153, and 163 and the power terminals 144, 154, and 164 are placed as illustrated in FIGS. 4B and 4C, even if noise is generated from a bus bar at the on/off switching of a voltage, it is possible to suppress the adverse effect of the noise on the detection result.

Since the magnetic sensing units 14 and 15 and the magnetic sensing unit 16 are placed with offsets from the narrow-width portions 11A, 12A, and 13A toward opposite sides in the Y axis, the orientation of magnetism detected by the magnetic sensing unit 16 is opposite when compared with the magnetic sensing units 14 and 15. With the current sensor 30, therefore, control is made so that an output from the magnetic sensing unit 16 is electrically reversed.

Embodiment 4

Figures 5A, 5B, 5C, 5D:
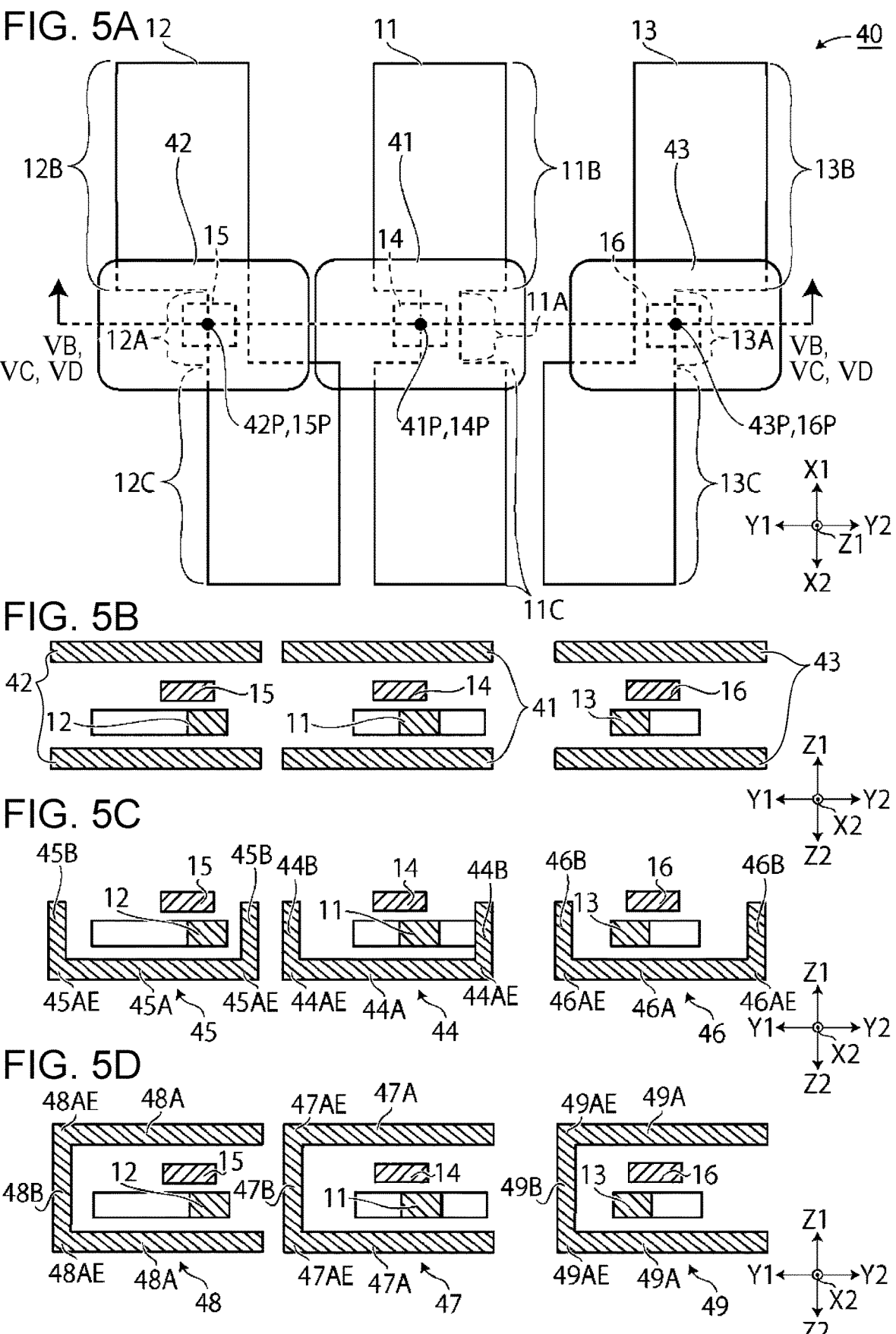
FIG. 5A is a plan view illustrating bus bars and magnetic sensing units in embodiment 4.
FIG. 5B is a sectional view along line VB-VB.
FIG. 5C is a sectional view along line VC-VC in a variation.
FIG. 5D is a sectional view along line VD-VD in another variation.

FIG. 5A is a plan view illustrating bus bars 11, 12, and 13 and magnetic sensing units 14, 15, and 16 in a current sensor 40 according to this embodiment, and FIG. 5B is a sectional view along line VB-VB in FIG. 5A. The current sensor 40 in this embodiment differs from the current sensor 10 in that the current sensor 40 has shields 41, 42, and 43.

The shields 41, 42, and 43 may be formed from a metal plate in a flat plate shape, and may be placed on at least any one side of the Z1 side and Z2 side of the magnetic sensing units 14, 15, and 16 in the Z-axis direction. The shields 41, 42, and 43 may be placed at positions at which there is a match between their centers 41P, 42P, and 43P and the centers 14P, 15P, and 16P of the magnetic sensing units 14, 15, and 16 when viewed along the Z-axis direction.

The shields 41 are placed on both sides, Z1 side and Z2 side, so as to face each other in parallel, as illustrated in FIG. 5B. Also, the shields 41 are placed at positions at which there is a match between their centers 41P and the center 14P of the magnetic sensing unit 14 when viewed along the Z-axis direction. Each of the shields 41, 42, and 43 is preferably formed from a ferromagnet as a magnetic shield formed from a magnetic material, and has a structure in which a plurality of metal plates, in a rectangular shape in plan view, having the same shape and the same size are laminated up and down.

The shield 41 has a size enough to cover the narrow-width portion 11A and magnetic sensing unit 14 in the width direction (X-axis direction) and longitudinal direction (Y-axis direction). The two shields 41 overlap each other so that they do not protrude from each other when viewed along the Z-axis direction. With the magnetic sensing unit 14, since the shields 41 are placed so as to interpose the magnetic sensing unit 14 in this way, it is possible to block foreign magnetic fields (external magnetic fields) such as induced magnetic fields generated due to currents flowing in the adjacent bus bars 12 and 13 and to suppress the adverse effect of the foreign magnetic fields.

The shields 42 that cover the narrow-width portion 12A and magnetic sensing unit 15 and the shields 43 that cover the narrow-width portion 13A and magnetic sensing unit 16 are also structured similarly as with the shield 41. If the adverse effect of the foreign magnetic field is small, for example, only one shield 41, only one shield 42, and only one shield 43 may be provided.

FIG. 5C is a sectional view at portions in shields 44, 45, and 46 according to a variation, the portions corresponding to line VC-VC in FIG. 5A. As illustrated in the drawing, the shield 44 may have an opposing portion 44A placed in the Z-axis direction, as well as side surface portions 44B protruding from one ends 44AE on both sides of the opposing portion 44A toward the Z1 side in the Z-axis direction.

The opposing portion 44A may be placed on the Z2 side of the magnetic sensing unit 14 and bus bar 11 in the Z-axis direction. The side surface portions 44B may be placed on both sides of the magnetic sensing unit 14 and bus bar 11 in the Y-axis direction. Although the opposing portion 44A is placed on the Z2 side in the example illustrated in FIG. 5C, the opposing portion 44A may be placed on the Z1 side.

The shields 45 and 46 have opposing portions 45A and 46A, one ends 45AE and 46AE, and side surface portions 45B and 46B, as with the shield 44. The opposing portions 45A and 46A are placed on one side of the magnetic sensing units 15 and 16 and bus bars 12 and 13 in the Z-axis direction. The side surface portions 45B and 46B are placed at one ends 45AE and 46AE on both sides of the opposing portions 45A and 46A in the Y-axis direction.

FIG. 5D is a sectional view at portions in shields 47, 48, and 49 according to another variation, the portions corresponding to line VD-VD in FIG. 5A. As illustrated in the drawing, the shield 47 has opposing portions 47A placed so that their plate surfaces face each other with a spacing between them in the Z-axis direction, as well as a linking portion 47B that links one ends 47AE of the opposing portions 47A together.

The opposing portions 47A are placed on both sides of the magnetic sensing unit 14 and bus bar 11 in the Z-axis direction, that is, on the Z1 side and on the Z2 side. The linking portion 47B is placed on one side of the magnetic sensing unit 14 and bus bar 11 in the Y-axis direction.

Although the linking portion 47B is placed on the Y1 side in the example illustrated in FIG. 5D, the linking portion 47B may be placed on the Y2 side.

The shields 48 and 49 have opposing portions 48A and 49A, one ends 48AE and 49AE, and linking portions 48B and 49B, as with the shield 47. The shields 48 and 49 are placed on one side of the magnetic sensing units 15 and 16 and bus bars 12 and 13 in the Y-axis direction.

A structure will be described below that can be thought when the current sensor 40 has the shields 47, 48, and 49 (appropriately referred to below as a plurality of shields) having the structure illustrated in FIG. 5D. For example, slits (not illustrated) into which the linking portions 47B, 48B, and 49B can be inserted are formed in the circuit board 7 (see FIGS. 2A and 2B), on which the magnetic sensing units 14, 15, and 16 are mounted, along the X axis. When the slit is open toward the X1-direction side, the circuit board 7 is inserted from the X2-direction side and is placed in the case member 8b. Alternatively, a notch (not illustrated) with a size enough for the circuit board 7 to be inserted may be formed at the upper end (end on the Z1 side) of a wall of the case member 8b on the X2 side. In this case, when a convex portion (not illustrated) that will engage the notch is formed at the lower end (end on the Z2 side) of a wall of the cover member 8a on the X2 side, the circuit board 7 can be easily inserted and the notch is blocked by the convex part, making it possible to prevent foreign matter from entering the interior of the current sensor 40.

The current sensor 40 may have a structure, as described below, different from FIG. 2. In the description below, directions, names, and reference characters in FIGS. 2 and 5D will be used. The case member 8b has an inner space, which is open toward the X2-direction side. The one and other opposing portions of the plurality of shields are buried in the walls on the Z1-direction side and on the Z2-direction side. The circuit board 7 is structured so that it has slits into which the linking portions 47B, 48B, and 49B can be inserted, the slits being open toward the X1-direction side, and that the circuit board 7 can be inserted into the case member 8b from the X2-direction side. The cover member 8a is locked on the X2-direction side of the cover member 8a so as to cover the opening in the case member 8b. In a structure like this, each shield is positioned with higher precision.

Embodiment 5

Figure 6:
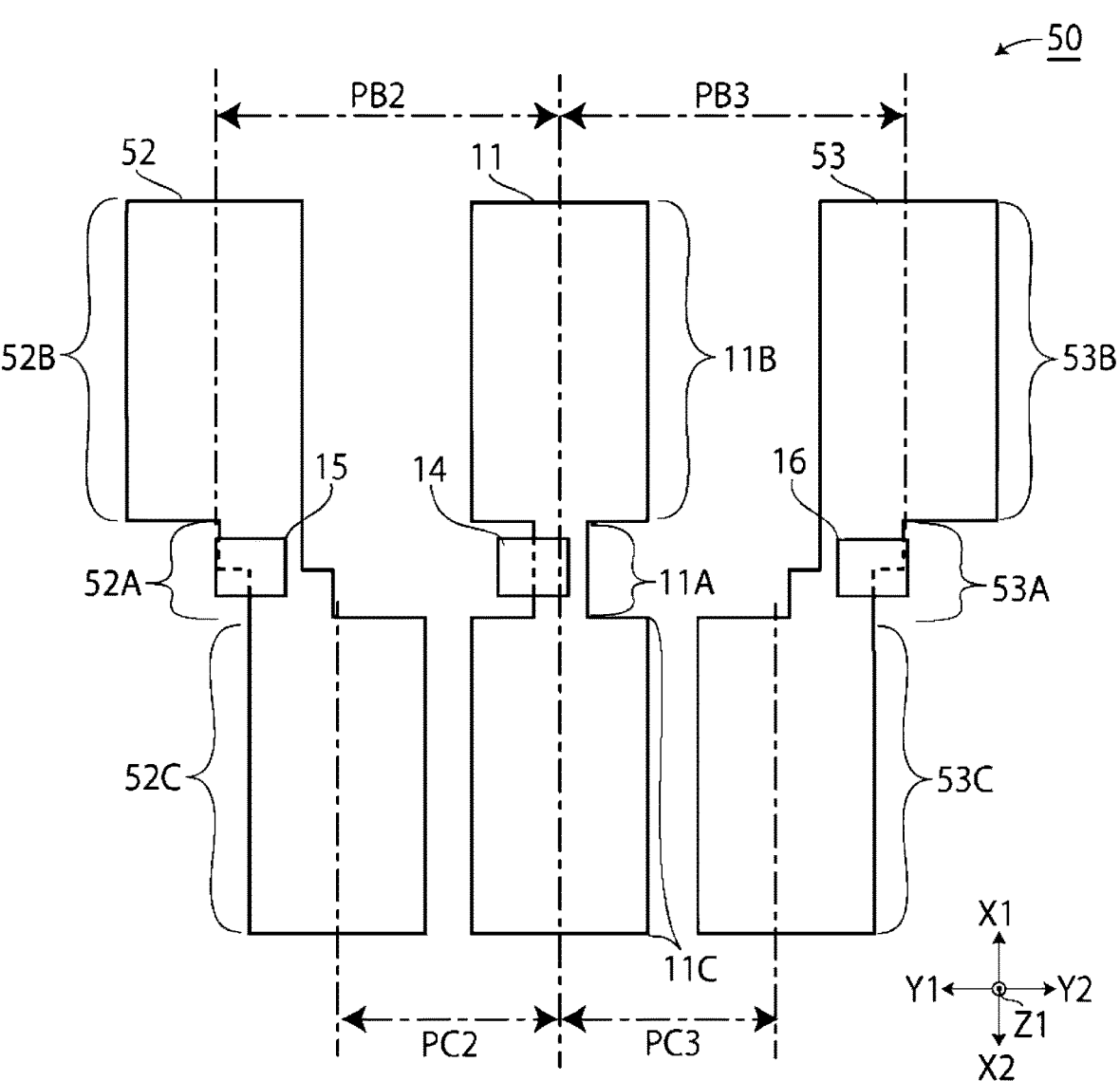
FIG. 6 is a plan view of bus bars and magnetic sensing units in embodiment 5.

FIG. 6 is a plan view illustrating bus bars 11, 52, and 53 and magnetic sensing units 14, 15, and 16 in a current sensor 50 according to this embodiment.

The current sensor 50 illustrated in the drawing differs from the current sensor 10 in that the bus bars 52 and 53 have narrow-width portions 52A and 53A formed in a stepped shape. There may be a difference in interval between wide-width portions 11B, 52B, and 53B (PB2=PB3) and wide-width portions 11C, 52C, and 53C (PC2=PC3). Then, the wide-width portion 52B and wide-width portion 52C may be connected together through the narrow-width portion 52A formed in a stepped shape. Similarly, the wide-width portion 53B and wide-width portion 53C may be connected together through the narrow-width portion 53A formed in a stepped shape.

However, in a structure in which pitches differ like this, the current sensor 50 is preferably formed so that the ends (end faces), in the Y-axis direction, of the narrow-width portions 11A, 52A, and 53A facing the magnetic sensing units 14, 15, and 16 become straight lines parallel to the X axis when viewed along the Z-axis direction, as in the current sensors 10, 20, 30, and 40. In this shape, a magnetic field to be detected, the magnetic field being based on currents eligible for detection, is likely to be formed in parallel to the detection directions of the magnetic sensing units 14, 15, and 16.

For example, with the current sensor 10 in embodiment 1 illustrated in FIG. 1, at the bus bar 12, the end face of the narrow-width portion 12A on the Y2 side in the Y-axis direction (end face on another side) and the end face of the wide-width portion 12B on the Y2 side in the Y-axis direction (end face on another side) may be flush with each other; and the end face of the narrow-width portion 12A on the Y1 side in the Y-axis direction (end face on one side) and the end face of the wide-width portion 12C on the Y1 side in the Y-axis direction (end face on one side) may be flush with each other. Similarly, at the bus bar 13, the end face of the narrow-width portion 13A on the Y1 side in the Y-axis direction (end face on one side) and the end face of the wide-width portion 13B on the Y1 side in the Y-axis direction (end face on one side) may be flush with each other; and the end face of the narrow-width portion 13A on the Y2 side in the Y-axis direction (end face on another side) and the end face of the wide-width portion 13C on the Y2 side in the Y-axis direction (end face on another side) may be flush with each other. In this structure, currents in the narrow-width portions 12A and 13A flow along the X-axis direction, so magnetisms generated due to the currents can be precisely sensed by the magnetic sensing units 15 and 16. Therefore, it is possible to make measurement error small, the measurement error being caused by a component of a magnetic field eligible for being detected, the component being in a direction diagonal with respect to the detection direction.

Embodiment 6

Figures 7A, 7B:
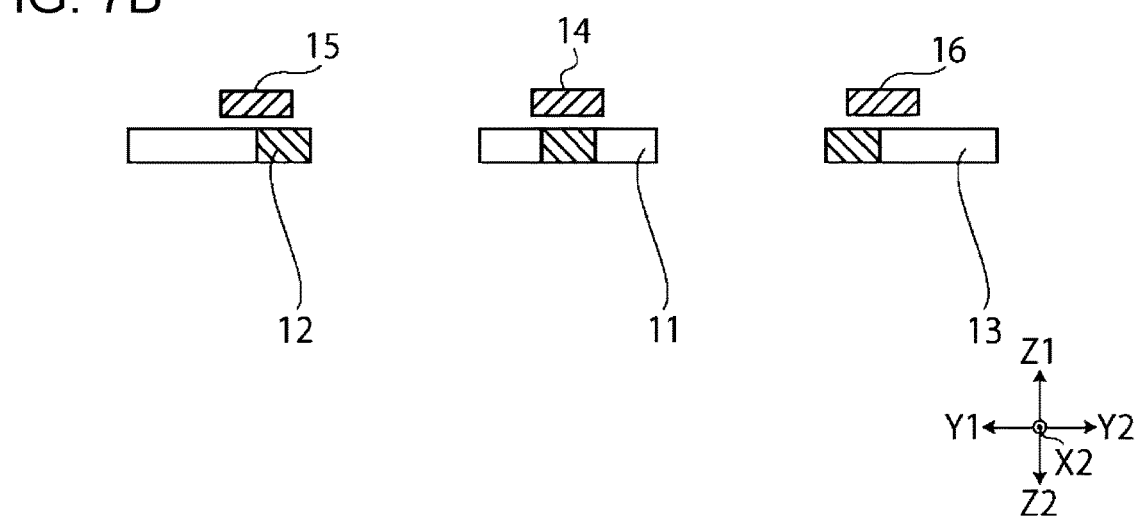
FIG. 7A is a plan view illustrating bus bars and magnetic sensing units in embodiment 6.
FIG. 7B is a sectional view along line VIIB-VIIB.

FIG. 7A is a plan view illustrating bus bars 11, 12, and 13 and magnetic sensing units 14, 15, and 16 in a current sensor 60 according to this embodiment, and FIG. 7B is a sectional view along line VIIB-VIIB in FIG. 7A. The current sensor 60 differs from the current sensor 10 in that the magnetic sensing unit 14 is placed without being offset from the narrow-width portion 11A that faces the magnetic sensing unit 14 when viewed along the Z axis. That is, in the current sensor 60, the straight line L14, extending in the X-axis direction and passing through the center 14P of the magnetic sensing unit 14 in the Y-axis direction, matches the straight line L11A passing through the center 11AP of the narrow-width portion 11A in the Y-axis direction, when viewed along the Z axis. In this structure, even when the bus bar 11 is shaped so as to be line symmetric with respect to the straight line L11A, the intervals PD5 and PD6 in the Y-axis direction among the magnetic sensing units 14, 15, and 16 can be made equal.

Embodiment 7

Figures 8A, 8B:
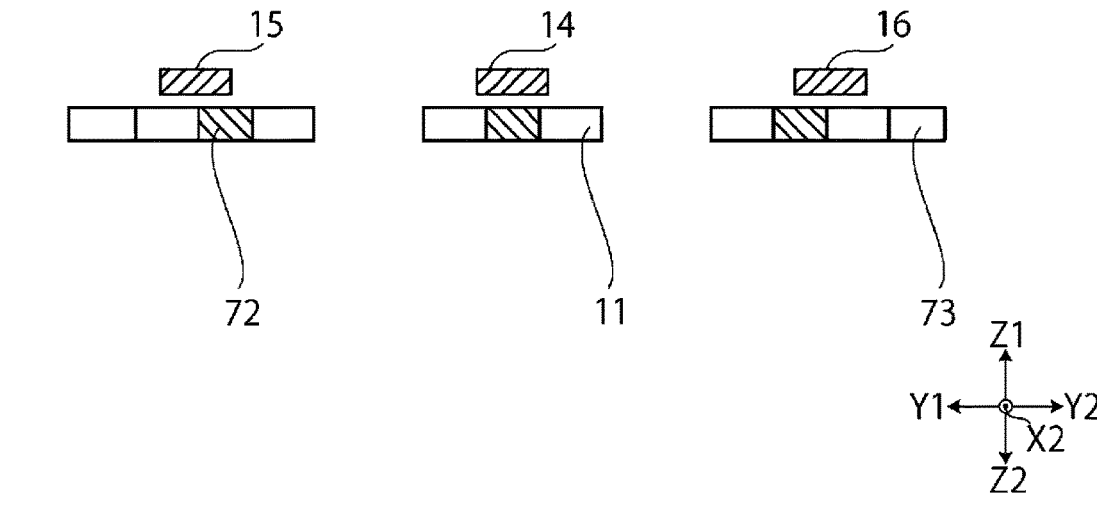
FIG. 8A is a plan view illustrating bus bars and magnetic sensing units in embodiment 7.
FIG. 8B is a sectional view along line VIIIB-VIIIB.

FIG. 8A is a plan view illustrating bus bars 11, 72, and 73 and magnetic sensing units 14, 15, and 16 in a current sensor 70 according to this embodiment, and FIG. 8B is a sectional view along line VIIIB-VIIIB in FIG. 8A. The current sensor 70 differs from the current sensor 60 in that the intervals among the wide-width portions 11B, 72B, and 73B (PB2=PB3) and the intervals among the wide-width portions 11C, 72C, and 73C (PC2=PC3) are equal to each other. Therefore, the intervals among the narrow-width portions

11A, 72A, and 73A (PA2=PA3) are also equal to the above intervals. That is, with the current sensor 70, the shapes of the bus bars 11, 72, and 73 are the same and the straight lines L11, L72, and L73, each of which passes through the midpoint of the relevant bus bar in the Y-axis direction, are placed at equal intervals in the Y-axis direction.

Even the current sensor 70 having the bus bars 11, 72, and 73 in the same shape provides advantageous effects similar to those of a current sensor having bus bars in different pitches between the X1 and X2 sides. That is, in the current sensor 70, the magnetic sensing units 15 and 16 are offset in opposite directions in the Y-axis direction (toward the Y1 side and Y2 side) from the narrow-width portions 72A and 73A, when viewed along the Z axis. In this placement, it is possible to improve the measurement precision of the current sensor 70 with the suppression of the adverse effect of a magnetic field generated in the vicinity of the corners 11BR and 11CR of the bus bar 11 on the magnetic sensing units 15 and 16.

Example

The current sensor 40 according to embodiment 4 illustrated in FIGS. 5A and 5B was used to pass a current through a bus bar, and error was measured generated in magnetic sensing units adjacent to a magnetic sensing unit facing the bus bar through which the current was passed.

Comparative Example

Figures 10A, 10B:
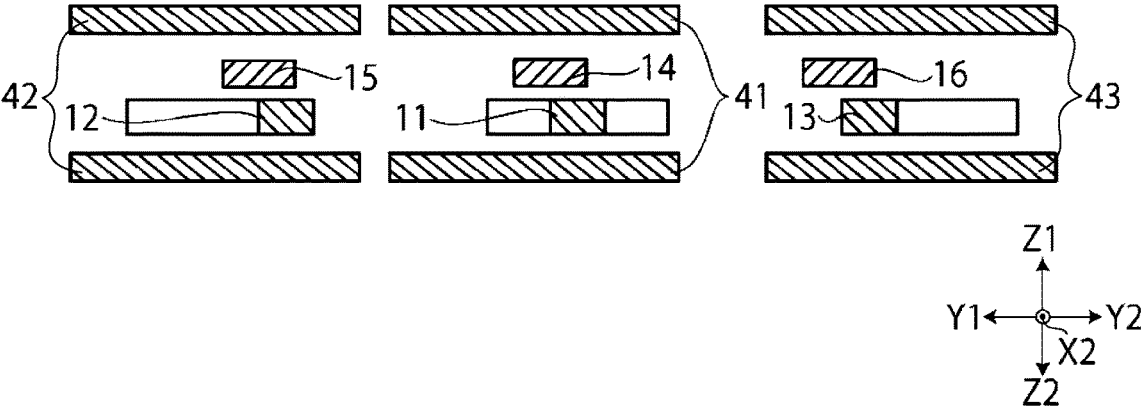
FIG. 10A is a plan view illustrating the shapes of conventional bus bars and conventional magnetic sensing units and their positional relationship.
FIG. 10B is a sectional view along line XB-XB.

FIG. 10A is a plan view illustrating bus bars 11, 12, and 13 and magnetic sensing units 14, 15, and 16 in a current sensor 80 in a comparative example, and FIG. 10B is a sectional view along line XB-XB in FIG. 10A. The current sensor 80 differs from the current sensor 40 only in that the magnetic sensing unit 16 is offset in the Y1 direction rather than the Y2 direction from the narrow-width portion 13A when viewed along the Z axis. Other points in the structure are the same as in the current sensor 40. The current sensor 80 was used to pass a current through a bus bar as in example 1, and error was measured that were generated in magnetic sensing units adjacent to a magnetic sensing unit facing the bus bar through which the current was passed.

Results

TABLE 1

| | | RESULTS OF EXAMPLE | | |
| --- | --- | --- | --- | --- |
| | | Magnetic sensing unit affected by other than the sensing target | | |
| | Error (%) | Magnetic sensing unit 14 | Magnetic sensing unit 15 | Magnetic sensing unit 16 |
| Live phase | Bus bar 11 | — | 0.7 | 0.0 |
| | Bus bar 12 | 0.7 | — | 0.7 |
| | Bus bar 13 | 0.1 | 0.4 | — |

TABLE 2

| | | Magnetic sensing unit affected by other than the sensing target | | |
|---|---|---|---|---|
| | Error (%) | Magnetic sensing unit 14 | Magnetic sensing unit 15 | Magnetic sensing unit 16 |
| Live phase | Bus bar 11 | — | 0.7 | 0.0 |
| | Bus bar 12 | 0.7 | — | 1.1 |
| | Bus bar 13 | 0.1 | 0.4 | — |

As illustrated in Table 1, when a current was passed through the bus bar 12, the current sensor 40 in the example, in which the magnetic sensing unit 16 was offset in the Y2 direction, was able to more greatly suppress error generated in the magnetic sensing unit 16 upon the reception of the adverse effect of magnetism generated by a flow of the current through the bus bar 12 than the current sensor 80, in which the magnetic sensing unit 16 was offset in the Y1 direction.

The present invention is useful as a current sensor that has three channels for which mutually related currents such as three-phase alternating-currents are measured and is superior in measurement precision.

What is claimed is:

1. A current sensor comprising: a plurality of bus bars each extending in a first direction and being arranged side by side along a second direction orthogonal to the first direction, the plurality of bus bars including a first bus bar, a second bus bar arranged on one side of the first bus bar, and a third bus bar arranged on the other side of the first bus bar;

a plurality of magnetic sensing units provided for the plurality of bus bars, each magnetic sensing unit facing corresponding one of the plurality of bus bars in a third direction orthogonal to the first and second directions, and being configured to sense a magnetic field generated by a flow of a current under measurement in the corresponding one of the plurality of bus bars; and a plurality of shields provided for the plurality of bus bars, each shield facing corresponding one of the plurality of bus bars in the third direction, wherein each of the first bus bar, the second bus bar, and the third bus bar is formed in a plate shape having a plate surface perpendicular to the third direction, each of the first, the second, and the third bus bars including:

a narrow-width portion, which the magnetic sensing unit faces;

a first wide-width portion connected to one side of the narrow-width portion in the first direction, the first wide-width portion having a width in the second direction greater than that of the narrow-width portion; and a second wide-width portion connected to another side of the narrow-width portion in the first direction, the second wide-width portion having a width in the second direction greater than that of the narrow-width portion, and wherein, when viewed from the third direction, a second magnetic sensing unit facing the second bus bar is offset from a center of the narrow-width portion of the second bus bar toward a first side in the second direction, while a third magnetic sensing unit facing the third bus bar is offset from a center of the narrow-width portion of the third bus bar toward a second side opposite to the first side in the second direction.

2. A current sensor comprising: a plurality of bus bars each extending in a first direction and being arranged side by side along a second direction orthogonal to the first direction, the plurality of bus bars including a first bus bar, a second bus bar arranged on one side of the first bus bar, and a third bus bar arranged on the other side of the first bus bar; and a plurality of magnetic sensing units provided for the plurality of bus bars, each magnetic sensing unit facing corresponding one of the plurality of bus bars in a third direction orthogonal to the first and second directions, and being configured to sense a magnetic field generated by a flow of a current under measurement in the corresponding one of the plurality of bus bars, wherein each of the first bus bar, the second bus bar, and the third bus bar is formed in a plate shape having a plate surface perpendicular to the third direction, each of the first, the second, and the third bus bars including:

a narrow-width portion, which the magnetic sensing unit faces;

a first wide-width portion connected to one side of the narrow-width portion in the first direction, the first wide-width portion having a width in the second direction greater than that of the narrow-width portion; and a second wide-width portion connected to another side of the narrow-width portion in the first direction, the second wide-width portion having a width in the second direction greater than that of the narrow-width portion, wherein, when viewed from the third direction, a second magnetic sensing unit facing the second bus bar is offset from a center of the narrow-width portion of the second bus bar toward a first side in the second direction, while a third magnetic sensing unit facing the third bus bar is offset from a center of the narrow-width portion of the third bus bar toward a second side opposite to the first side in the second direction, and wherein the current sensor lacks a shield for the plurality of magnetic sensing unit that blocks a magnetic field from an outside.

3. The current sensor according to claim 1, wherein, when viewed from the third direction, the first wide-width portions of the first bus bar, the second bus bar, and the third bus are placed side by side at first intervals in the second direction, while the second wide-width portions of the first bus bar, the second bus bar, and the third bus bar are placed side by side at second intervals in the second direction.

4. The current sensor according to claim 3, wherein the first interval is greater than the second interval.

5. The current sensor according to claim 1, wherein the narrow-width portions of the first bus bar, the second bus bar, and the third bus bar have same dimensions in the second direction and the first direction, wherein, when viewed from the third direction, at least part of the narrow-width portion of the first bus bar, at least part of the narrow-width portion of the second bus bar, and at least part of the narrow-width portion of the third bus bar are aligned along the second direction, and wherein a first magnetic sensing unit facing the first bus bar, the second magnetic sensing unit, and the third magnetic sensing unit are aligned along the second direction.

6. The current sensor according to claim 1, wherein the first wide-width portions of the first bus bar, the second bus bar, and the third bus bar have a same width in the second direction; and wherein the second wide-width portions of the first bus bar, the second bus bar, and the third bus bar have a same width in the second direction.

7. The current sensor according to claim 1, wherein the first wide-width portion and the second wide-width portion of the first bus bar have a same width in the second direction, the first wide-width portion and the second wide-width portion of the second bus bar have a same width in the second direction, and the first wide-width portion and the second wide-width portion of the third bus bar have a same width in the second direction.

8. The current sensor according to claim 3, wherein the narrow-width portions of the first bus bar, the second bus bar, and the third bus bar are placed at equal intervals in the second direction, when viewed from the third direction.

9. The current sensor according to claim 8, wherein a first magnetic sensing unit facing the first bus bar, the second magnetic sensing unit, and the third magnetic sensing unit are placed at equal intervals in the second direction, when viewed along the third direction.

10. The current sensor according to claim 3, wherein the first bus bar is line symmetric with respect to a first center line which is a straight line parallel to the first direction and passing through a center of the narrow-width portion of the first bus bar in the second direction, while the second bus bare and the third bus bar are line symmetric with respect to a second center line which is a straight line parallel to the first direction and passing through a center between the narrow-width portion of the second bus bar and the narrow-width portion of the third bus bar in the second direction, and wherein the first center line and the second center line match each other when viewed from the third direction.

11. The current sensor according to claim 1, wherein a center of a first magnetic sensing unit facing the first bus bar in the second direction is offset from a center of the narrow-width portion of the first bus bar in the second direction, when viewed from the third direction.

12. The current sensor according to claim 1, wherein a first magnetic sensing unit facing the first bus bar, the second magnetic sensing unit, and the third magnetic sensing unit are identical, and wherein, when viewed from the third direction, the second magnetic sensing unit and the third magnetic sensing unit are placed in opposite orientations with respect to the first direction and the second direction, and the first magnetic sensing unit is either placed in a same orientation as the second sensing unit and offset from the narrow-width portion of the first bus bar toward one side in the second direction, or placed in a same orientation as the third magnetic sensing unit and offset from the narrow-width portion of the first bus bar toward another sided in the second direction.

13. The current sensor according to claim 12, wherein each of the first, the second, and the third magnetic sensing units includes:

a sensor unit for sensing magnetism;

a signal output terminal protruding from the sensor unit, and a power supply terminal protruding from the sensor unit, and wherein the signal output terminal and the power supply terminal are disposed at positions which do not overlap the narrow-width portion of the corresponding bus bar, when viewed from the third direction.

14. The current sensor according to claim 1, wherein each of the plurality of shields is a flat metal plate and disposed on at least one side of the corresponding bus bar in the third direction, such that a center of the shield is located within the magnetic sensing unit facing the corresponding bus bar when viewed from the third direction.

15. The current sensor according to claim 1, wherein each of the plurality of shields is formed from a metal plate, each shield including:

an opposing portion disposed on one side of the corresponding bus bar and the magnetic sensing unit in the third direction; and side portions extending from both ends of the opposing portion in the second direction toward the magnetic sensing unit such that the side portions are disposed on both sides of the magnetic sensing unit and the bus bar in the second direction.

16. The current sensor according to claim 1, wherein in the second bus bar, an end face of the narrow-width portion on the second side in the second direction and an end face of the first wide-width portion on the second side in the second direction are flush with each other, while an end face of the narrow-width portion on the first side in the second direction and an end face of the second wide-width portion on the first side in the second direction are flush with each other, and wherein in the third bus bar, an end face of the narrow-width portion on the first side in the second direction and an end face of the first wide-width portion on the first side in the second direction are flush with each other, while an end face of the narrow-width portion on the second side in the second direction and an end face of the second wide-width portion on the other side in the second direction are flush with each other.

\* \* \* \* \*